(12) United States Patent
Azadet

(10) Patent No.: US 6,771,198 B2
(45) Date of Patent: Aug. 3, 2004

(54) METHOD AND APPARATUS FOR CONVERTING BETWEEN ANALOG AND DIGITAL DOMAINS USING FREQUENCY INTERLEAVING

(75) Inventor: Kameran Azadet, Morganville, NJ (US)

(73) Assignee: Agere Systems Inc., Allentown, PA (US)

( * ) Notice: Subject to any disclaimer, the term of this patent is extended or adjusted under 35 U.S.C. 154(b) by 131 days.

(21) Appl. No.: 10/106,990

(22) Filed: Mar. 25, 2002

(65) Prior Publication Data

US 2003/0132870 A1 Jul. 17, 2003

Related U.S. Application Data

(60) Provisional application No. 60/347,462, filed on Jan. 11, 2002.

(51) Int. Cl.[7] .............................................. H03M 1/00
(52) U.S. Cl. ...................................................... 341/110
(58) Field of Search ................................ 341/110, 155, 341/118, 126

(56) References Cited

U.S. PATENT DOCUMENTS 6,392,583 B1 * 5/2002 Bosselmann ................. 341/155

* cited by examiner

Primary Examiner—Brian Young

(57) ABSTRACT

A method and apparatus are disclosed for converting a signal between the analog and digital domains using frequency interleaving. The disclosed frequency interleaving techniques can be similarly applied to convert analog signals to the digital domain or vice-versa. An analog-to-digital converter decomposes the input broadband signal into N frequency bands that are separately sampled (quantized) before a Fourier transform is applied to convert the signal into the digital domain. Each of the frequency bands can be sampled in the corresponding narrow passband using narrow-band converters, such as passband Sigma-Delta converters, or can be returned to baseband prior to sampling. The various analog samples are then converted to the digital domain using an inverse Fourier transform, or another combining technique. Both sampling and analog-to-digital conversion can be performed at a speed that is N times slower than the input frequency. The disclosed frequency interleaving technique decomposes the input signal into frequency bands that are digitized separately at a slower rate. A disclosed calibration scheme corrects for phase and gain mismatches.

27 Claims, 14 Drawing Sheets

$$p(t) = \begin{cases} 1 & \text{if } -(1-\alpha)\frac{T}{2} \leq t \leq +(1-\alpha)\frac{T}{2} \\ 0 & \text{otherwise} \end{cases}$$

for α = 1/2

$$p(t) = \begin{cases} T & 0 \le |t| \le (1-\alpha)\dfrac{T}{2} \\ \dfrac{T}{2}\left[1 - \sin\left(\dfrac{\pi}{\alpha T}\left(|t| - \dfrac{T}{2}\right)\right)\right] & (1-\alpha)\dfrac{T}{2} \le |t| \le (1+\alpha)\dfrac{T}{2} \\ 0 & |t| \le (1+\alpha)\dfrac{T}{2} \end{cases}$$

for $\alpha = 1/2$

METHOD AND APPARATUS FOR CONVERTING BETWEEN ANALOG AND DIGITAL DOMAINS USING FREQUENCY INTERLEAVING

CROSS REFERENCE TO RELATED APPLICATIONS

This application claims the benefit of U.S. Provisional Application No. 60/347,462, filed Jan. 11, 2002.

FIELD OF THE INVENTION

The present invention relates generally to methods and apparatus for converting a signal between the analog and digital domains, and more particularly, to methods and apparatus for converting a signal between the analog and digital domains using frequency interleaving.

BACKGROUND OF THE INVENTION

Analog-to-digital (A/D) converters often employ time interleaving to reduce the required conversion speed using multiple analog-to-digital converters in parallel. Each parallel analog-to-digital converter operates at a proportionally slower speed to convert time-interleaved signal samples into the digital domain. Nonetheless, high-frequency RF signals must still be sampled accurately prior to each parallel analog-to-digital converter. Thus, despite the gains achieved with the reduced required conversion speed for each of the parallel analog-to-digital converters, the sampling accuracy requirement is not relaxed. It has been found that it is difficult to maintain a high conversion accuracy up to the Nyquist frequency (sampling frequency divided by two) when analog-to-digital conversion must be performed at 10 Gigasamples/second and beyond, even using the most exotic technologies and only low amplitude resolution, such as a four bit resolution.

As the operating speeds of applications increase, there is a corresponding need to increase the conversion speeds of the analog-to-digital converters used by such applications. Thus, the above-mentioned limitation caused by the sampling accuracy requirement becomes even more critical. Multi-Gigasamples/second analog-to-digital conversion, for example, has an increasingly important role in many applications, such as wideband optical communications, digital radio or high-speed oscilloscopes. A need therefore exists for methods and apparatus for converting a signal between the analog and digital domains that maintain a high conversion accuracy up to the Nyquist frequency. A further need exists for methods and apparatus for converting a signal between the analog and digital domains where both A/D conversion and signal sampling can be performed at much slower rates.

SUMMARY OF THE INVENTION

Generally, a method and apparatus are disclosed for converting a signal between the analog and digital domains using frequency interleaving. The disclosed analog-to-digital and digital-to-analog converters maintain a high conversion accuracy up to the Nyquist frequency. When converting a signal from the analog domain to a digital domain, for example, the input broadband signal is decomposed into N frequency bands that are separately sampled (quantized) before a Fourier transform is applied to convert the signal into the digital domain. Each of the frequency bands can be sampled in the corresponding narrow passband using narrow-band converters, such as passband Sigma-Delta converters, or can be returned to baseband prior to sampling. The various analog samples are then converted to the digital domain using an inverse Fourier transform, or another combining technique. In this manner, sampling and analog-to-digital conversion are both performed at a speed that is N times slower than the input frequency.

The present invention thus employs parallel analog-to-digital conversion of frequency-domain samples of the input signal. The disclosed frequency interleaving technique decomposes the input signal into frequency bands that are digitized separately at a slower rate. Time-domain samples are obtained by performing an inverse Fourier transform of the quantized frequency-domain samples. Analog-to-digital conversion and signal sampling are performed at a much lower rate, thereby maintaining a high conversion accuracy up to the Nyquist frequency and beyond. In addition, a calibration scheme is disclosed to correct for phase and gain mismatches.

A more complete understanding of the present invention, as well as further features and advantages of the present invention, will be obtained by reference to the following detailed description and drawings.

DETAILED DESCRIPTION

Figure 1:
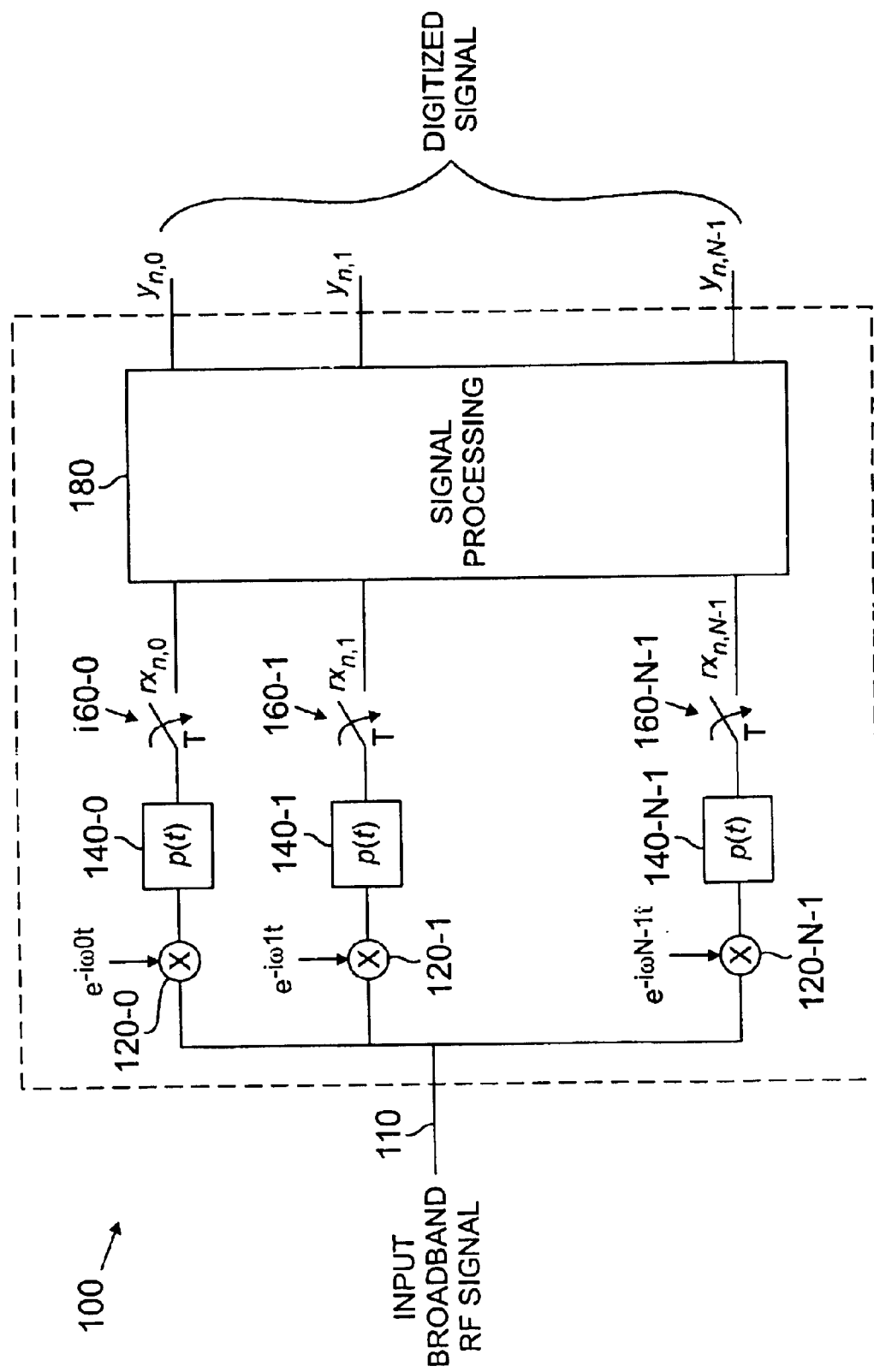
FIG. 1 illustrates an analog-to-digital converter 100 in accordance with the present invention.

FIG. 1 illustrates an analog-to-digital converter 100 in accordance with the present invention. According to one aspect of the invention, analog-to-digital conversion (as well as digital-to-analog conversion) is based on frequency interleaving, as well as time interleaving. Initially, the input broadband signal is decomposed into N frequency bands, and each frequency band is returned to a baseband frequency (IC). Each of the N frequency bands is sampled (quantized) before a Fourier transform is applied to convert the signal into the digital domain. Thus, sampling and analog-to-digital conversion are both performed at a speed that is N times slower than the input frequency.

As shown in FIG. 1, an input broadband RF signal, x(t), is received at an input 110 by the analog-to-digital converter 100. The input broadband signal is then decomposed into N frequency bands and returned to baseband using an array of input multipliers 120-0 through 120-N−1. Thereafter, each of the N baseband signals is filtered by a corresponding filter 140-0 through 140-N−1 and sampled by a corresponding switch 160-0 through 160-N−1 at a sampling period, T, that is N times slower than the input frequency to produce the sampled signal elements, $rx_{n,0}$ through $rx_{n,N-1}$. A Fourier transform is applied to the sampled signal elements by a signal processor 180 to produce the digitized signal $y_{n,0}$ through $Y_{n,N-1}$ (N samples at a time).

In the following discussion, the following notation is used:

$T_s$=Sampling period of A/D $$F_s = \frac{1}{T_s}, \text{ Sampling Frequency}$$

T=integration period=N $T_s$ $N_c$=number of carriers x(t)=input signal (continuous-time)

Figure 2:
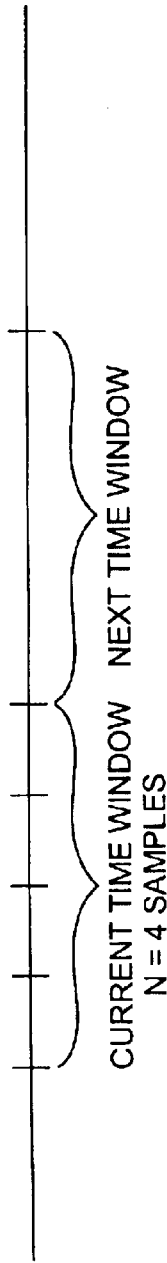
FIG. 2 illustrates various time windows that are employed in the frequency interleaving technique of the present invention.

FIG. 2 defines the various time windows of interest. As shown in FIG. 2, in an exemplary implantation four (N=4) samples are taken in each time window.

If a function f(t) is periodic, of period T, then it can be decomposed in Fourier Series as follows:

$$c_k = \frac{1}{T} \int_0^T f(t) \cdot e^{-2i\pi k \frac{t}{T}} dt \qquad \text{Eq. (1)}$$

where, $$f(t) = \sum_{k=-\infty}^{+\infty} c_k e^{+2i\pi k \frac{t}{T}} \qquad \text{Eq. (2)}$$

Since the input signal, x(t), is not necessarily periodic of period T, a periodic expansion of the input signal, referred to as $x_p(t)$, can be considered conceptually. The above expression applies to $x_p(t)$, and therefore equation (1) becomes:

$$X_k = \frac{1}{T} \int_0^T x(t) \cdot e^{-2i\pi k \frac{t}{T}} dt \qquad \text{Eq. (3)}$$

where, $$x(t) = \sum_{k=-\infty}^{+\infty} X_k e^{+2i\pi k \frac{t}{T}}, \text{ for } t \in [0, T] \qquad \text{Eq. (4)}$$

In equation (3), an infinite number of Fourier coefficients are required. In practical cases, a finite number of Fourier coefficients are evaluated, and a close estimate of x(t) is given by:

$$X_k = \frac{1}{T} \int_0^T x(t) \cdot e^{-2i\pi k \frac{t}{T}} dt \qquad \text{Eq. (5)}$$

where, $$\tilde{x}(t) = \sum_{k=-N_c}^{+N_c} X_k e^{+2i\pi k \frac{t}{T}}, \text{ for } t \in [0, T] \qquad \text{Eq. (6)}$$

$$\tilde{x}(mT_s) = \sum_{k=-N_c}^{+N_c} X_k e^{+2i\pi k \frac{m}{N}}, \text{ for } m \in \{0, 1, \ldots, N-1\} \qquad \text{Eq. (7)}$$

Since $T=NT_S$, equation (7) becomes:

$$\tilde{x}(mT_s) = \sum_{k=-N_c}^{+N_c} X_k e^{+2i\pi k \frac{mT_s}{T}}, \text{ for } m \in \{0, 1, \ldots, N-1\} \qquad \text{Eq. (8)}$$

In order to compute values of the input signal beyond the interval {0,T}, the expressions can be extended to other intervals {nT, (n+1)T}. Thus, by setting:

$$X_{n,k} = \frac{1}{T} \int_{nT}^{nT+T} x(t) \cdot e^{-2i\pi k \frac{t}{T}} dt \qquad \text{Eq. (9)}$$

$$y_{n,m} = \tilde{x}((nN+m)T_s), \text{ for } m \in \{0, 1, \ldots, N-1\} \text{ and } n \in Z, \qquad \text{Eq. (10)}$$

the following is obtained:

$$y_{n,m} = \sum_{k=-N_c}^{+N_c} X_{n,k} e^{+2i\pi k \frac{m}{N}} \qquad \text{Eq. (11)}$$

Figure 3:
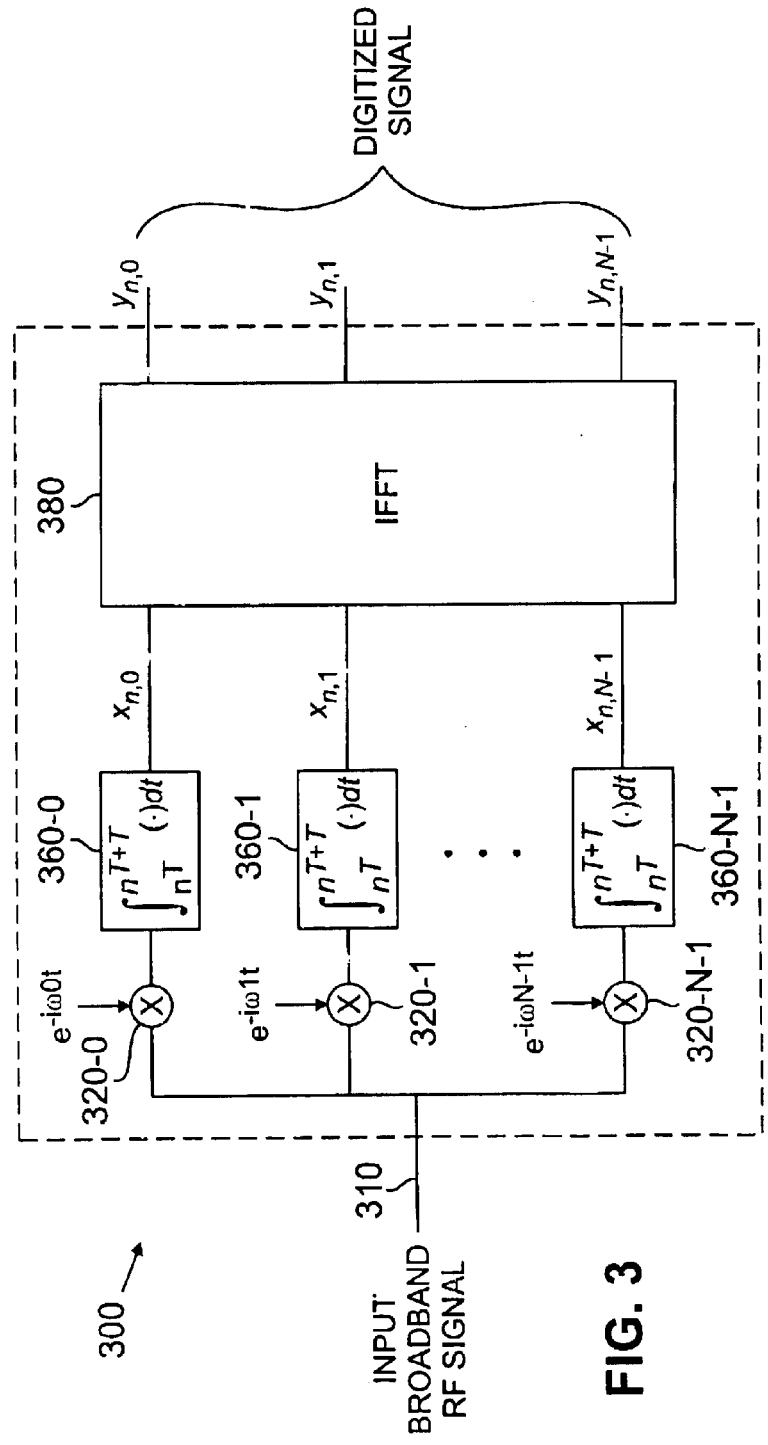
FIG. 3 is a schematic block diagram illustrating an implementation of the analog-to-digital converter of FIG. 1 in accordance with the present invention.

FIG. 3 illustrates an analog-to-digital converter 300 that implements equation (11) in accordance with the present invention. As shown in FIG. 3, an input broadband RF signal, x(t), is received at an input 310 by the analog-to-digital converter 300. The input broadband signal is then decomposed into N frequency bands and returned to baseband using an array of input multipliers 320-0 through 320-N−1. Thereafter, each of the N baseband signals is filtered and sampled by a corresponding stage 360-0 through 360-N−1 that implements equation (9) to generate the corresponding value, $X_{n,k}$. An inverse Fourier transform is applied to the sampled signal elements at stage 380 to produce the digitized signal $Y_{n,0}$ through $Y_{n,N-1}$ (N samples at a time), in accordance with equation (11).

Figure 4:
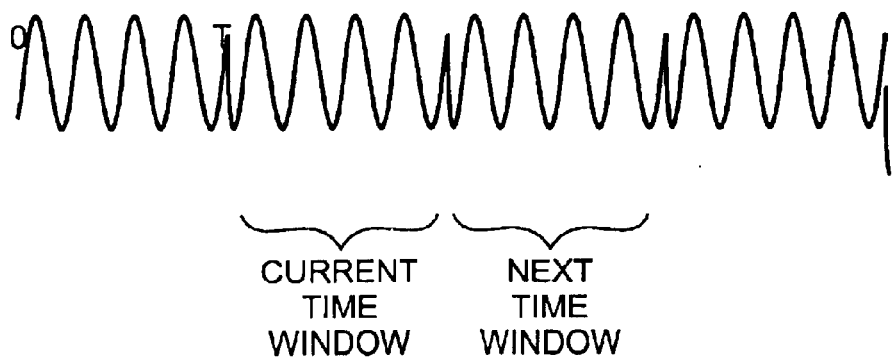
FIG. 4 illustrates a periodic extension of the input signal that approximates a non-periodic signal in accordance with one embodiment of the present invention.

The periodic extension of x(t), called $x_p(t)$, may represent discontinuities at the transition from one time window to the next, as shown in FIG. 4. As suggested by FIG. 4, the periodic extension, $x_p(t)$, is a good approximation of a non-periodic signal in the middle of each window, but is not necessarily a good approximation at the boundaries of each time window. Due to these discontinuities, it is important that the Fourier series be computed using an infinite number of coefficients, or with carrier frequencies up to very high frequencies. Truncating the above sum to $N_C$ carriers will create errors mostly at points of discontinuities. This phenomenon may also be analyzed in the frequency domain. The frequency response of a rectangular impulse (the time window) is a sinc function in the frequency domain.

Figure 5:
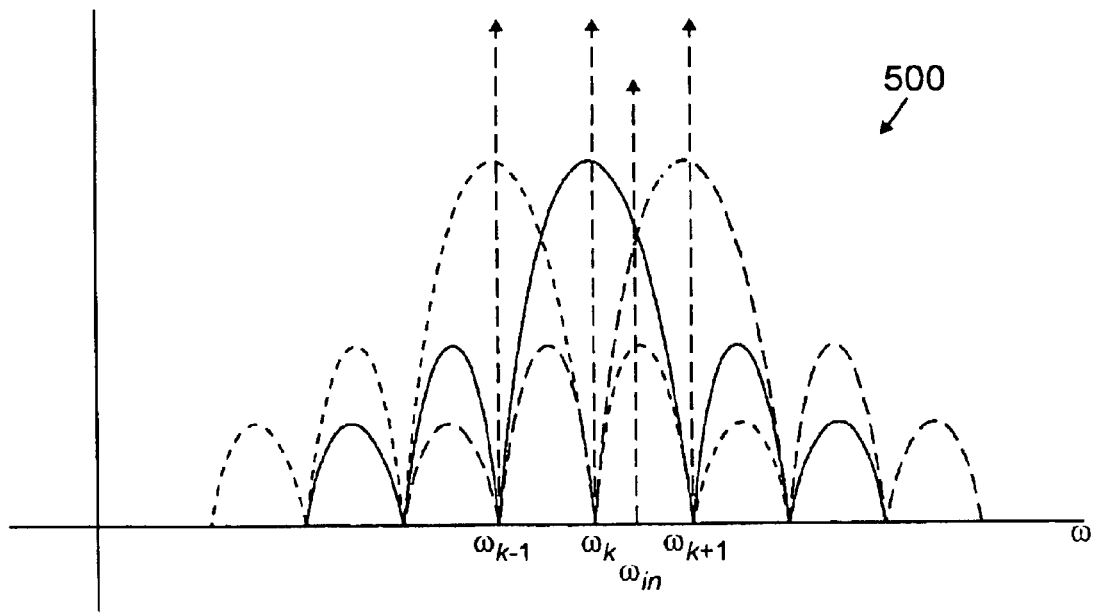
FIG. 5 illustrates a frequency response where the input frequency, $\omega_{in}$, lies somewhere between two adjacent carrier frequencies, $\omega_k$, and $\omega_{k+1}$.

For a given sinusoidal signal, if the input frequency is a sub-multiple of the carrier frequencies then only one Fourier coefficient is non-zero and the others are all equal to zero. FIG. 5 illustrates the general case, however, where the input frequency, (Din, lies somewhere between two adjacent carrier frequencies, $\omega_k$, and $\omega_{k+1}$ Thus, due to the infinite number of side lobes in the sinc function, it is necessary to take into account the contribution from all carrier frequencies up to infinite frequencies.

It has been found that an implementation of the analog-to-digital converter 300, where $N=N_C=16$ and $F_S=10GS/s$, would demonstrate a signal-to-noise ratio (SNR) on the order of only 10–20 dB, due to the boundary discontinuities discussed above in conjunction with FIG. 4. Thus, to avoid the problem of inaccuracy in the window boundaries, two solutions are possible. In a first solution, shown in FIG. 6, a periodic extension of period T is used and only points in a sub-window are considered, such as a time interval of length T'<T (for example, T'=T/2). Mathematically, the window may be expressed as follows:

$$p(t) = \begin{cases} 1 & \text{if } -(1-\alpha)\frac{T}{2} \leq t \leq +(1-\alpha)\frac{T}{2} \\ 0 & \text{otherwise} \end{cases} \qquad \text{Eq. (12)}$$

In this manner, the most reliable points in the middle of the window are maintained and the least reliable points on the boundary of the window are discarded.

Figure 7:
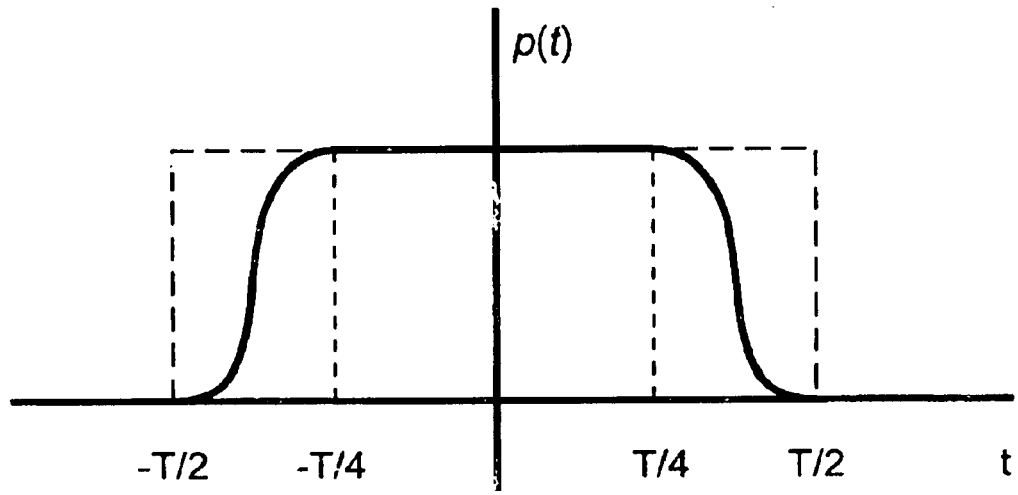
FIG. 7 illustrates a second exemplary window that may be employed to discard regions of discontinuity in the periodic extension technique of FIG. 4.

In a second solution, shown in FIG. 7, a different type of windowing can be used that allows a smooth periodic extension, or transition, from one time window to another. The raised cosine shape is an example of such a window. The raised cosine shape is defined as follows:

$$p(t) = \begin{cases} T & 0 \leq |t| \leq (1-\alpha)\frac{T}{2} \\ \frac{T}{2}\left[1 - \sin\left(\frac{\pi}{\alpha T}\left(|t| - \frac{T}{2}\right)\right)\right] & (1-\alpha)\frac{T}{2} \leq |t| \leq (1+\alpha)\frac{T}{2} \\ 0 & |t| > (1+\alpha)\frac{T}{2} \end{cases} \qquad \text{Eq. (13)}$$

It has been found that an implementation of the analog-to-digital converter 300, where $N=N_C=16$ and $F_S=10GS/s$, where a raised cosine pulse window is employed would demonstrate an improved signal-to-noise ratio (SNR) on the order of up to 60 dB (which is beyond 8 bit accuracy). The SNR is not severely affected when the window shape is changed and similar results were observed with a Trapezoidal window (which is easier to generate than the raised cosine pulse window).

Figure 6:
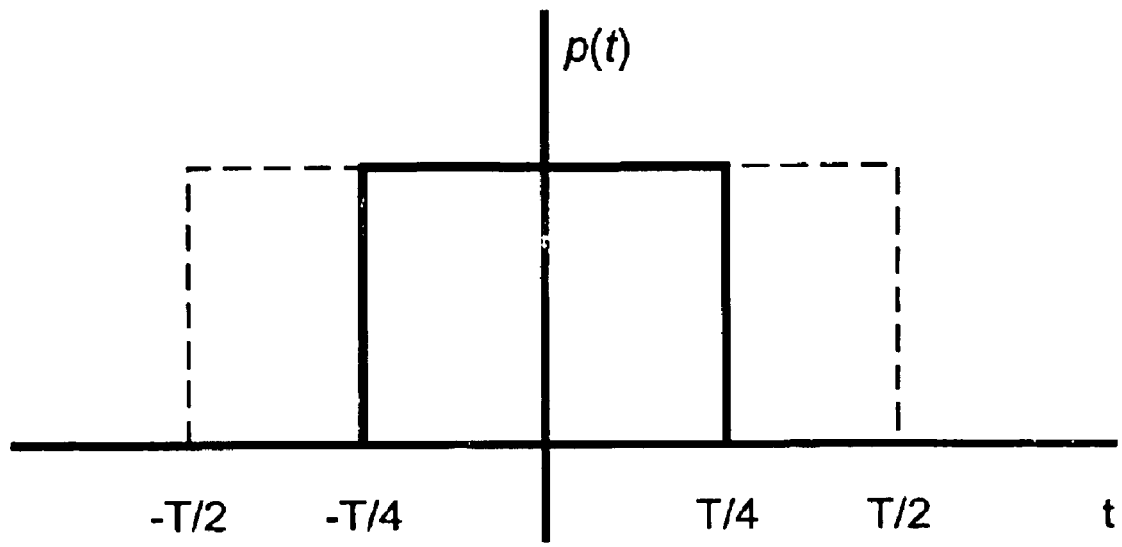
FIG. 6 illustrates a first exemplary window that may be employed to discard regions of discontinuity in the periodic extension technique of FIG. 4.
Figure 8:
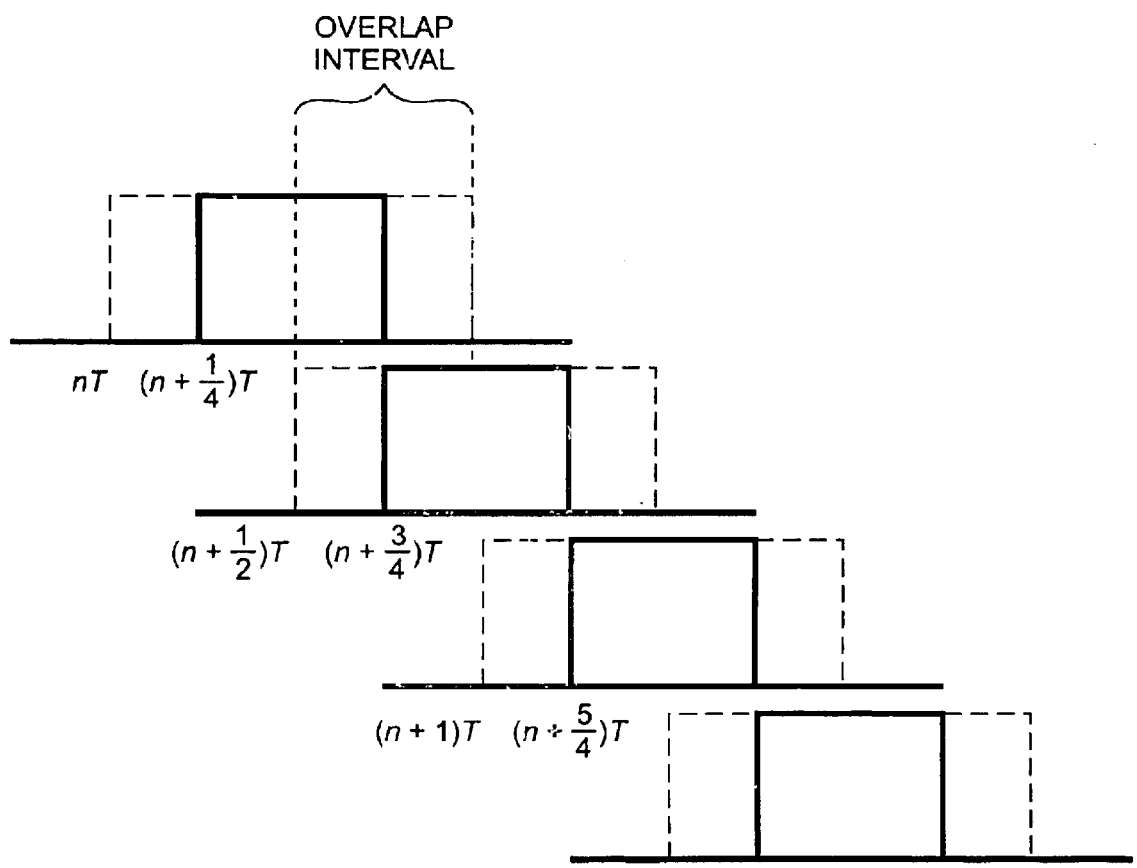
FIG. 8 illustrates an overlapping window technique employed with the window of FIG. 6.

Since a number of points in the analysis windows shown in FIGS. 6 and 7 are discarded, this requires overlapping windows in order to obtain all points in time domain. The overlapping interval for the windowing of FIG. 6 is shown in FIG. 8. As shown in FIG. 8, since N/2 points are discarded for each window, two overlapping windows are employed to ensure N data points are retained.

Figure 9:
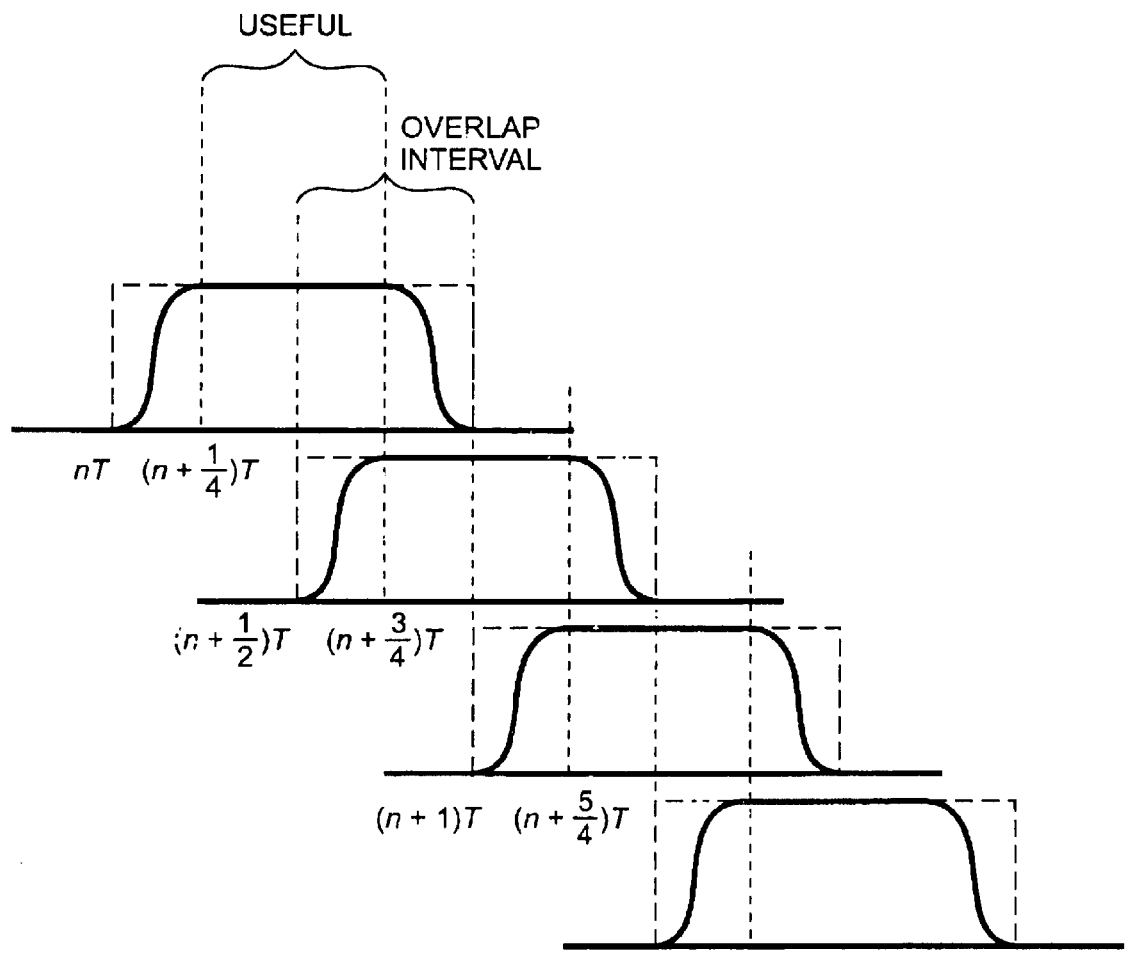
FIG. 9 illustrates an overlapping window technique employed with the window of FIG. 7.

The overlapping interval for the raised cosine windowing of FIG. 7 is shown in FIG. 9. As shown in FIG. 9, since points are discarded outside of the useful window, adjacent windows must be overlapped in the manner shown in FIG. 9 to retain N data points.

Figure 10:
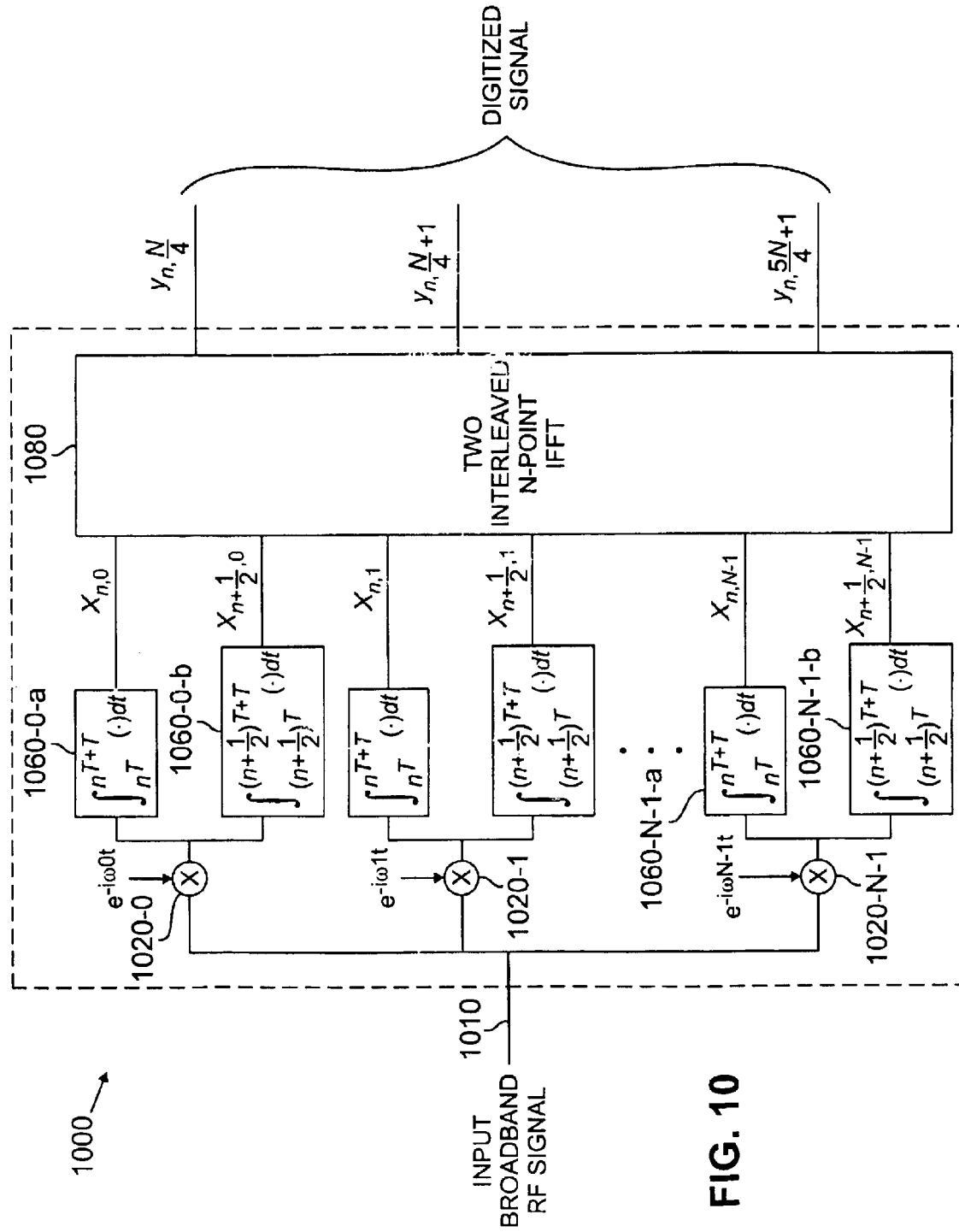
FIG. 10 illustrates an analog-to-digital converter that implements an overlapping window technique in accordance with one embodiment of the present invention.

FIG. 10 illustrates an analog-to-digital converter 1000 that implements overlapping windows in accordance with one embodiment of the present invention. As shown in FIG. 10, an input broadband RF signal, x(t), is received at an input 1010 by the analog-to-digital converter 1000. The input broadband signal is then decomposed into N frequency bands and returned to baseband using an array of input multipliers 1020-0 through 1020-N–1. Thereafter, each of the N baseband signals is filtered and sampled using two overlapping windows a, b by a corresponding stage 1060-0-a and 1060-0-b through 1060-N–1-a and 1060-N–1-b to generate the corresponding value, $X_{n,k}$. It is noted that the first window, a, for each frequency band, n, extends from nT to (nT+T) and the second window, b, for each frequency band, n, extends from (n+½)T to ((n+½)T+T). Two interleaved N-point inverse Fourier transforms are applied for each N points of sampled signal elements at stage 1080 to produce the digitized signal $y_{n,N/4}$ through $y_{n,(5N/4)-1}$. N samples are processed at a time, with N inputs and N/2 outputs for each IFFT. Two groups of N/2 points provides the desired N output values. It is noted that N/2 boundary samples are discarded and N/2 samples are considered for each IFFT, in accordance with equation (11).

When using a tapered windowing in the intervals {nT, (n+1)T}, the Fourier coefficients can be expressed as:

$$X_{n,k} = \frac{1}{T}\int_{nT}^{nT+T} p(t-nT) \cdot x(t) \cdot e^{-2i\pi k \frac{t}{T}} dt \qquad \text{Eq. (14)}$$

By changing variables, equation (14) becomes:

$$X_{n,k} = \frac{1}{T}\int_{-\frac{T}{2}}^{+\frac{T}{2}} p\left(t + \frac{T}{2}\right) \cdot x\left(t + \left(n + \frac{1}{2}\right)T\right) \cdot e^{-2i\pi k \frac{t}{T}} dt \qquad \text{Eq. (15)}$$

p is the weighting function that determines the shape of the window. Assuming p is symmetrical and bounded to {0,T}, then:

$$p\left(t + \frac{T}{2}\right) = p\left(-t + \frac{T}{2}\right) \qquad \text{Eq. (16)}$$

Thus, equation (15) becomes (in equivalent form):

$$X_{n,k} = \frac{1}{T}\int_{-\infty}^{+\infty} p\left(-t + \frac{T}{2}\right) \cdot x\left(t + \left(n + \frac{1}{2}\right)T\right) \cdot e^{-2i\pi k \frac{t}{T}} dt \qquad \text{Eq. (17)}$$

$$X_{n,k} = \frac{1}{T}\int_{-\infty}^{+\infty} p\left(-t + \left(n + \frac{1}{2}\right)T + \frac{T}{2}\right) \cdot x(t) \cdot e^{-2i\pi k \frac{t}{T}} dt \qquad \text{Eq. (18)}$$

$$X_{n,k} = \frac{1}{T}\int_{-\infty}^{+\infty} p(-t + (n+1)T) \cdot x(t) \cdot e^{-2i\pi k \frac{t}{T}} dt \qquad \text{Eq. (19)}$$

Figure 11:
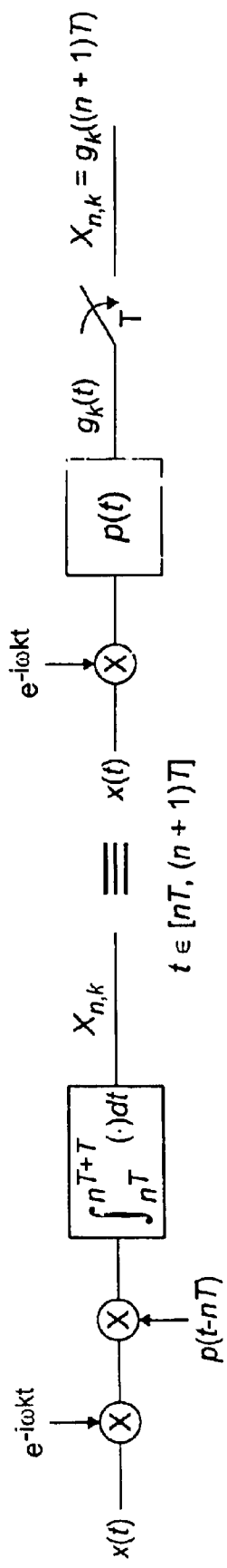
FIG. 11 illustrates a representation of the convolution of $p(t)$ and $x(t) \cdot e^{-2i\pi kt/T}$.

In equation (19), the convolution of p(t) and $x(t) \cdot e^{-2i\pi kt/T}$ may be represented as shown in FIG. 11, where, by setting:

$$g_k(u) = \frac{1}{T}\int_{-\infty}^{+\infty} p(u-t) \cdot x(t) \cdot e^{-2i\pi k \frac{t}{T}} dt, \qquad \text{Eq. (20)}$$

$X_{n,k}$ can be expressed as follows:

$$X_{n,k} = g_k((n+1)T) \qquad \text{Eq. (21)}$$

Figure 12:
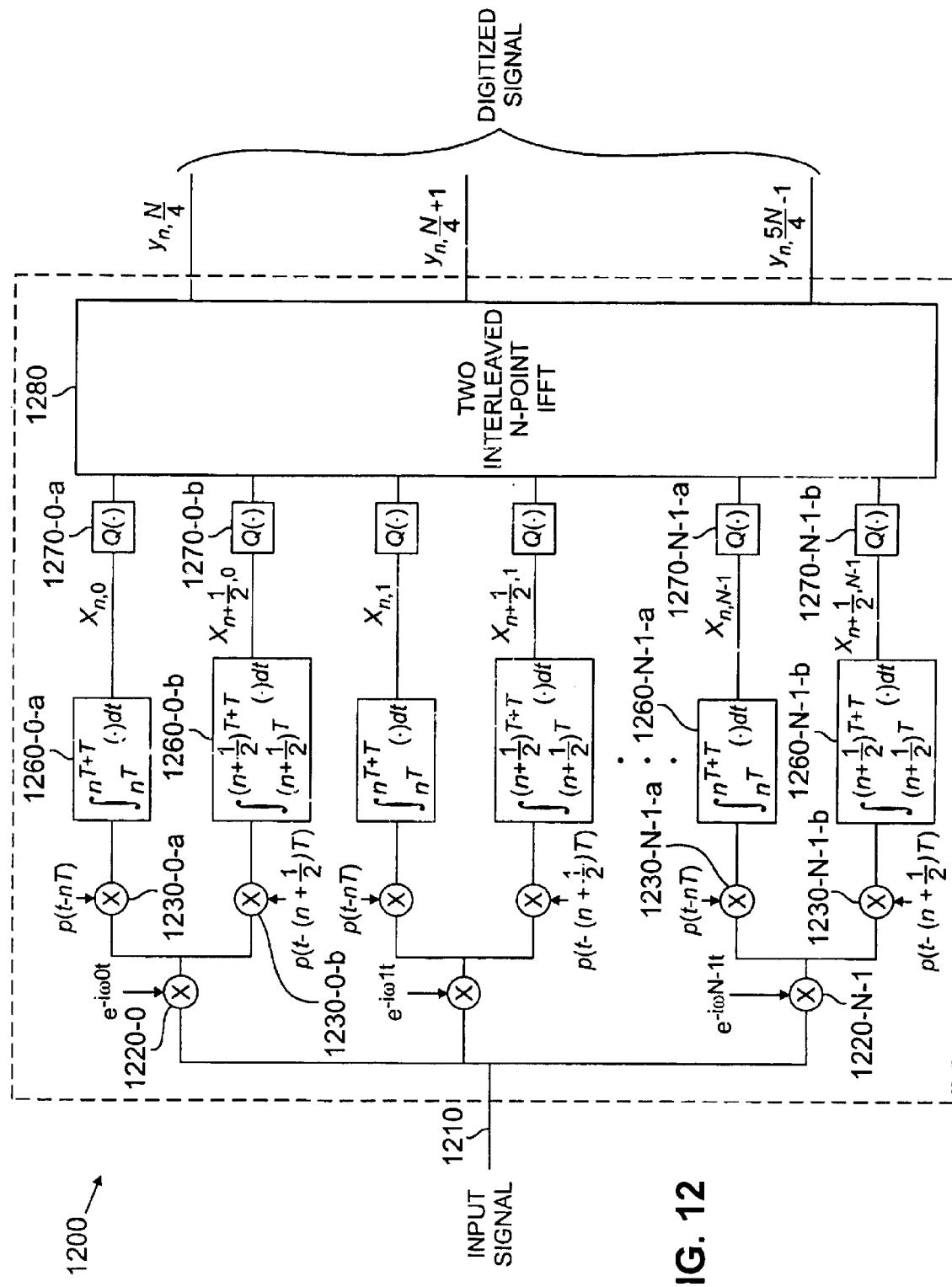
FIG. 12 illustrates an analog-to-digital converter that implements overlapping shaped windows in accordance with another embodiment of the present invention.

FIG. 12 illustrates an analog-to-digital converter 1200 that implements overlapping shaped windows in accordance with another embodiment of the present invention. As shown in FIG. 12, an input broadband RF signal, x(t), is received at an input 1210 by the analog-to-digital converter 1200. The input broadband signal is then decomposed into N frequency bands and returned to baseband using an array of input multipliers 1220-0 through 1220-N–1. Thereafter, each of the N baseband signals is processed using two overlapping shaped windows a, b that are shaped by a corresponding multiplier 1230a, 1230b and then filtered and sampled by a corresponding stage 1260-0-a and 1260-0-b (for the first frequency band) through 1260-N–1-a and 1260-N–1-b (for the last frequency band) to generate the corresponding value, $X_{n,k}$. Each complex output can be quantized to b bits using a quantizer 1270-0-a and 1270-0-b (for the first frequency band) through 1270-N–1-a and 1270-N–1-b (for the last frequency band).

Two interleaved N-point inverse Fourier transforms are applied for each N points of sampled signal elements at stage 1280 to produce the digitized signal $y_{n,N/4}$ through $y_{n,(5N/4)-1}$. N samples are processed at a time, with N inputs and N/2 outputs for each IFFT. Two groups of N/2 points provides the desired N output values. It is noted that N/2 boundary samples are discarded and N/2 samples are considered for each IFFT, in accordance with equation (19). It has been found that an implementation of the analog-to-digital converter 1200, where $N=N_C=16$ and $F_S=10$ GS/s, where a raised cosine pulse window is employed, would demonstrate an improved signal-to-noise ratio (SNR) on the order of up to 63 dB (for 12 bit quantization); up to 40 dB (for 8 bit quantization) and up to 20 dB (for 4 bit quantization).

Phase/Gain Error Calibration

Figure 13:
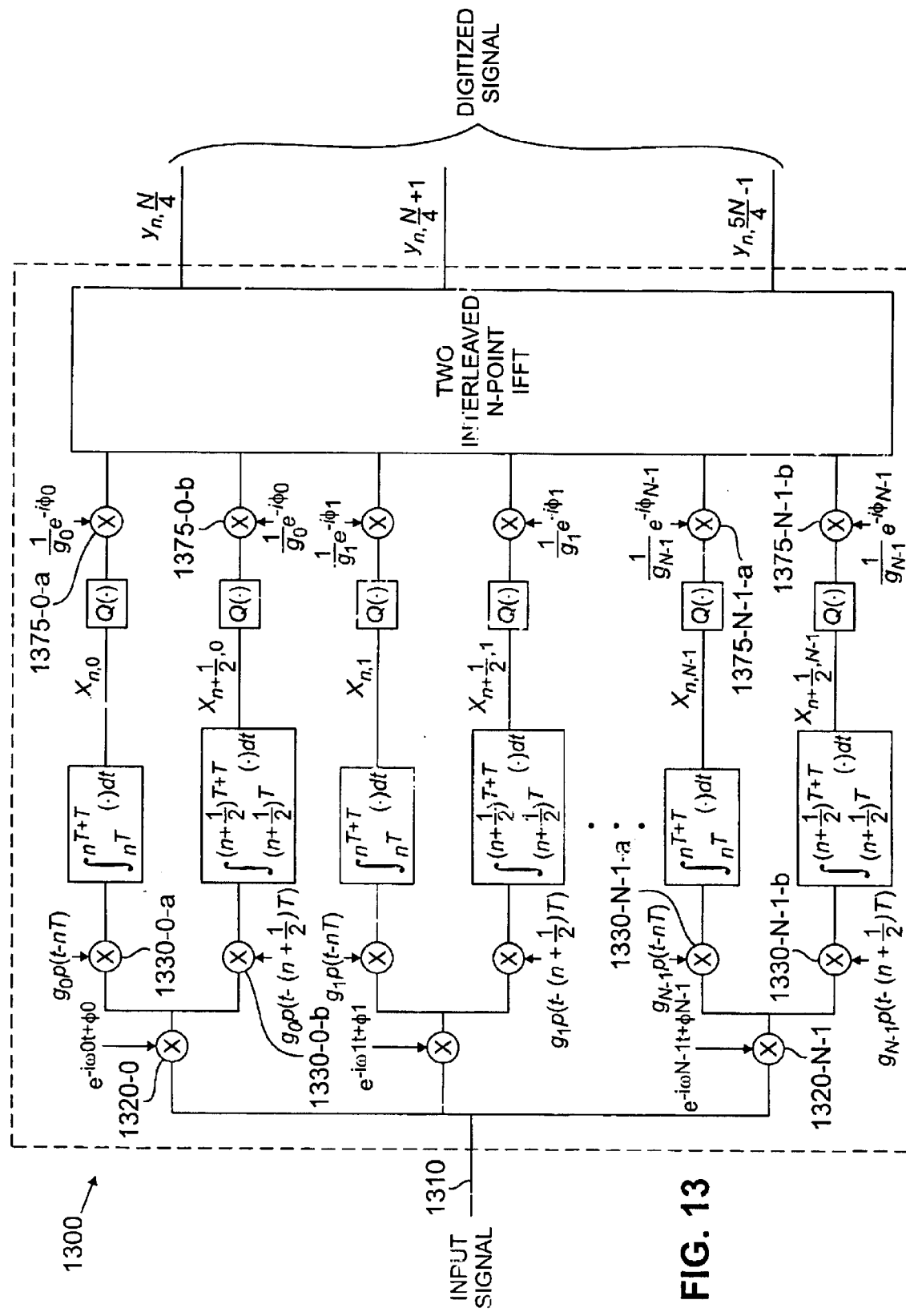
FIG. 13 illustrates an analog-to-digital converter that implements overlapping shaped windows and a digital calibration scheme to compensate for gain/phase mismatch in accordance with another embodiment of the present invention.

FIG. 13 illustrates an analog-to-digital converter 1300 that implements overlapping shaped windows and a digital calibration scheme to compensate for gain/phase mismatch in accordance with another embodiment of the present invention. Each of the components in FIG. 13 may be identical to those described above in conjunction with FIG. 12. Phase and gain errors must be computed and used to digitally compensate for phase/gain mismatches in the analog front-end.

As shown in FIG. 13, however, the input multipliers 1320-0 through 1320-N–1 introduce a phase error, $\phi$, and the window shaping multipliers 1330-0-a and 1330-0-b (for the first frequency band) through 1330-N–1-a and 1330-N–1-b (for the last frequency band) introduce a gain error, g. These phase and gain errors are removed in the digital domain by a calibration multiplier 1375-0-a and 1375-0-b (for the first frequency band) through 1375-N–1-a and 1375-N–1-b (for the last frequency band)

The calibration of gain/phase errors can be performed in two ways. First, if the input signal has well-known properties (for instance, it corresponds to a non-return-to-zero signal), then a cost function can be computed in real-time to adjust the values of gain/phase compensators, according to a process referred to as background calibration.

If no a priori knowledge of the signal is available, using an off-line calibration period and a well-known input sequence, the gain/phase compensators are adjusted to values that minimize the error between the digitized signal and the well-known input signal.

In the case of gain/phase errors:

$$X'_{n,k} = \frac{g_k e^{i\phi_k}}{T} \int_{nT}^{nT+T} x(t) \cdot e^{-2i\pi k \frac{t}{T}} dt \qquad \text{Eq. (22)}$$

$$y_{n,m} = \sum_{k=-N_C}^{+N_C} w_k X'_{n,k} e^{+2i\pi k \frac{m}{N}}, \qquad \text{Eq. (23)}$$

for $m \in \{0, 1, \ldots, N-1\}$ and $n \in Z$ where $w_k$ is a complex number to optimize that performs digital calibration of gain phase errors. The residual calibration error is given by:

$$e_{n,m} = y_{n,m} - x\left(\left(n + \frac{m}{N}\right)T\right) = \sum_{k=-N_C}^{+N_C} w_k X'_{n,k} e^{+2i\pi k \frac{m}{n}} - x_{n,m} \qquad \text{Eq. (24)}$$

In order to minimize the mean square error, a set of coefficients must be identified that minimizes:

$$E(|e_{n,m}|^2) \qquad \text{Eq. (25)}$$

By first decomposing the coefficient in real part and imaginary part:

$$w_k = w_k^{(r)} + i \cdot w_k^{(i)}, \qquad \text{Eq. (26)}$$

the gradient of the mean square error can be obtained by computing:

$$\frac{\partial E(|e_{n,m}|^2)}{\partial w_k^{(\cdot)}} = \frac{\partial E(e_{n,m} \cdot e_{n,m}^*)}{\partial w_k^{(\cdot)}} \qquad \text{Eq. (27)}$$

$$\frac{\partial E(|e_{n,m}|^2)}{\partial w_k^{(\cdot)}} = \frac{\partial E(e_{n,m})}{\partial w_k^{(\cdot)}} \cdot e_{n,m}^* + e_{n,m} \cdot \frac{\partial E(e_{n,m}^*)}{\partial w_k^{(\cdot)}} \qquad \text{Eq. (28)}$$

$$\begin{cases} \frac{\partial E(|e_{n,m}|^2)}{\partial w_k^{(r)}} = X'_{n,k} e^{2i\pi k \frac{m}{N}} \cdot e_{n,m}^* + e_{n,m} \cdot (X'_{n,k})^* e^{-2i\pi k \frac{m}{N}} = 2 \cdot \text{Re}\left(X'_{n,k} e^{2i\pi k \frac{m}{N}} \cdot e_{n,m}^*\right) \\ \frac{\partial E(|e_{n,m}|^2)}{\partial w_k^{(i)}} = i \cdot \left(X'_{n,k} e^{2i\pi k \frac{m}{N}} \cdot e_{n,m}^* - e_{n,m}(X'_{n,k})^* e^{-2i\pi k \frac{m}{N}}\right) = 2 \cdot i \cdot \text{Im}\left(X'_{n,k} e^{2i\pi k \frac{m}{N}} \cdot e_{n,m}^*\right) \end{cases} \qquad \text{Eq. (29)}$$

The w coefficients can be obtained using the steepest descent algorithm (step size $\mu$), where:

$$w_k(0)=1 \qquad \text{Eq. (30)}$$

$$w_k(l+1) = w_k(l) - \mu \cdot \left(X'_{n,k} e^{2i\pi k \frac{m}{N}} \cdot e^*_{n,m}\right) \quad \text{Eq. (31)}$$

Another interesting property of frequency interleaving is that a delayed version of the input can be represented using multiplications in the digital domain. If the input is delayed by D such that:

$$\frac{-T}{2N} \leq D \leq \frac{T}{2N} \quad \text{Eq. (32)}$$

$$X'_{n,k} = \frac{1}{T} \int_{nT}^{nT+T} x(t-D) \cdot e^{-2i\pi k \frac{t}{T}} dt \quad \text{Eq. (33)}$$

$$X'_{n,k} = \frac{1}{T} \int_{nT-D}^{nT+T-D} x(t) \cdot e^{-2i\pi k \frac{t-D}{T}} dt \quad \text{Eq. (34)}$$

$$X'_{n,k} = \frac{e^{2i\pi k \frac{D}{T}}}{T} \int_{nT-D}^{nT+T-D} x(t) \cdot e^{-2i\pi k \frac{t}{T}} dt \quad \text{Eq. (35)}$$

For a periodic signal x, of period T:

$$X'_{n,k} = \frac{e^{2i\pi k \frac{D}{T}}}{T} \int_{nT}^{nT+T} x(t) \cdot e^{-2i\pi k \frac{t}{T}} dt, \quad \text{Eq. (36)}$$

it is recognize that:

$$X'_{n,k} = e^{2i\pi k \frac{D}{T}} \cdot X_{n,k}. \quad \text{Eq. (37)}$$

Therefore, by setting:

$$w_k = e^{2i\pi k \frac{D}{T}}, \quad \text{Eq. (38)}$$

$$y_{n,m} = \sum_{k=-N_c}^{+N_c} w_k X'_{n,k} e^{+2i\pi k \frac{m}{N}}, \quad \text{Eq. (39)}$$

for $m \in \{0, 1, \ldots, N-1\}$ and $n \in Z$.

$y_{n,m}$ represent samples of the input signal delayed by D. This provides a simple method to adjust input sampling phase which involves only multiplications in the digital domain and no analog circuitry (such as Phase Locked Loops or Delay Locked Loops, as in standard clock recovery circuits). This is an interesting property of the frequency-domain representation.

Carrierless Frequency Interleaving

Figure 14:
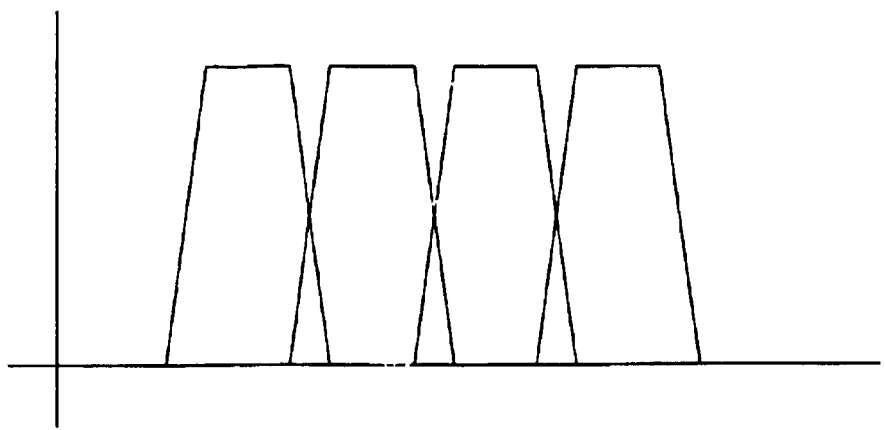
FIG. 14 illustrates an alternate embodiment of the present invention where the signal is sampled in a narrow passband using, e.g., sigma-delta converters.

FIG. 14 illustrates an alternate embodiment of the present invention where the signal is sampled in a narrow passband, rather than returning the signal to baseband prior to sampling (in the manner described above). A wideband converter could be implemented covering a wide frequency range using a plurality of narrow-band converters, such as passband Sigma-Delta converters that achieve high accuracy in a narrow frequency band. Thus, each Sigma-Delta converter quantizes the signal in the defined passband. The output of each different narrow band converter is combined (possibly added).

D/A Conversion

Figure 15:
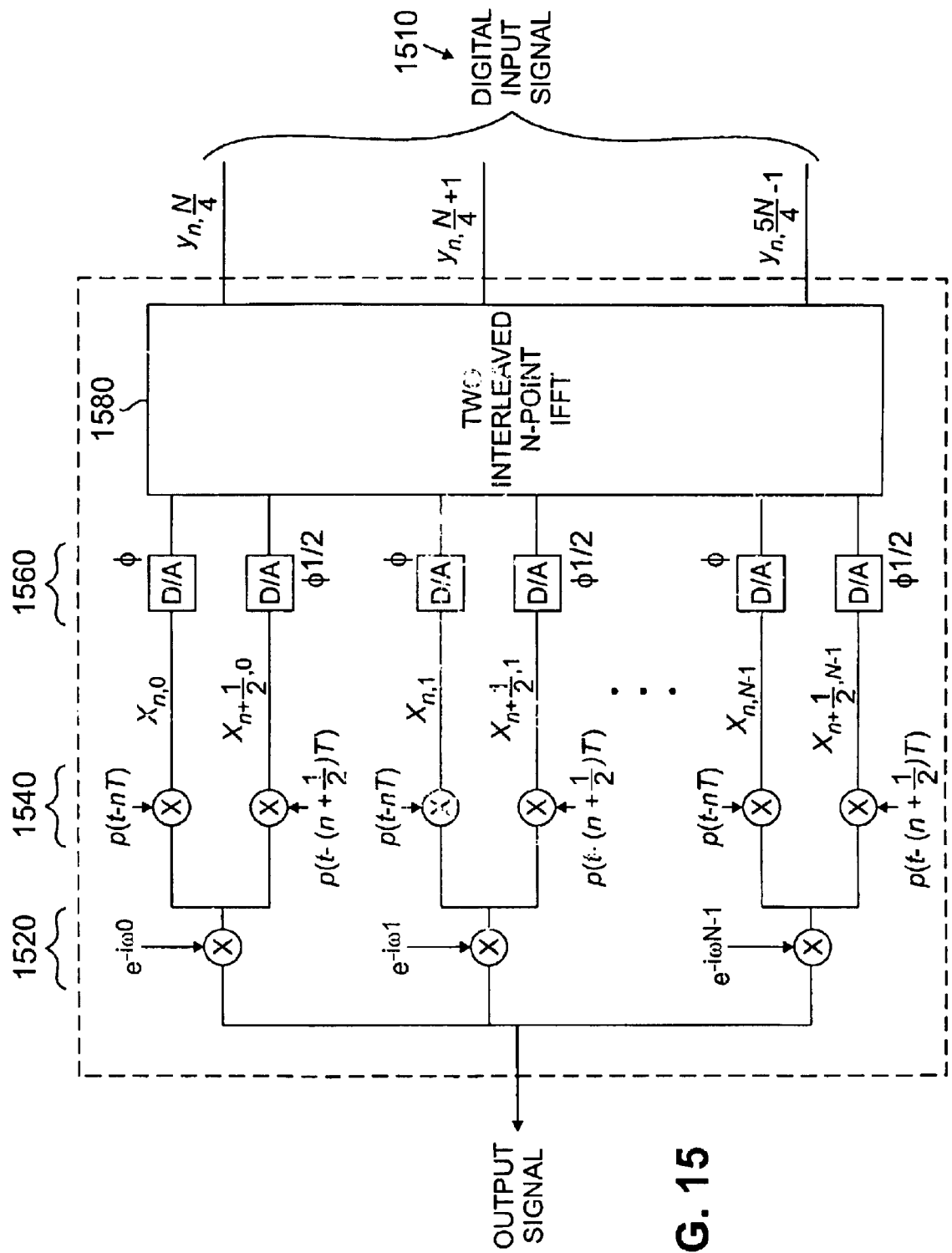
FIG. 15 illustrates a digital-to-analog converter that is an inverse to the analog-to-FIG. 14 illustrates an alternate embodiment of the present invention where the signal is sampled in a narrow passband using, e.g., sigma-delta converters.

FIG. 15 illustrates a digital-to-analog converter 1500 that corresponds to the analog-to-digital converter 1200 of FIG. 12 and implements overlapping shaped windows in accordance with an embodiment of the present invention. Each of the components in FIG. 15 may be identical to those described above in conjunction with FIG. 12. As shown in FIG. 15, a digital input signal, $y_{n,m}$, is received at an input 1510 by the digital-to-analog converter 1500. Two interleaved N-point Fourier transforms are applied to the digital input signal, $y_{n,m}$, at stage 1580. The digital samples are then converted to the analog domain at stage 1560, before the window shaping and frequency multiplying are performed at stages 1540 and 1520, respectively. Window shaping is discussed below in conjunction with FIG. 16. The broadband RF signal, x(t), is provided at the output of the digital-to-analog converter 1500.

Figure 16:
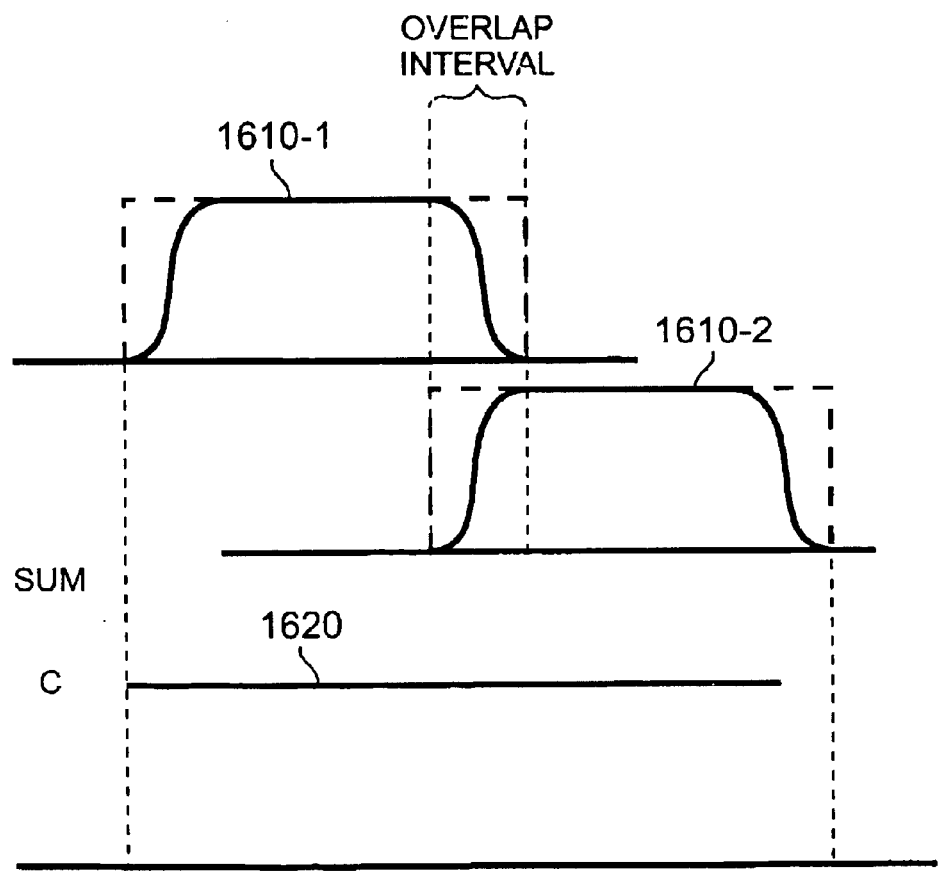
FIG. 16 illustrates a window shaping technique employed in the exemplary digital-to-analog converter of FIG. 15.

As previously indicated, A/D conversion allows redundant points to be easily removed. Redundancy is more difficult, however, for the case of D/A conversion. Therefore, as shown in FIG. 16, the overlapped windows 1610-1, 1610-2 for a digital-to-analog converter must be such that their sum 1620 in the time domain adds up to a constant, C. This is easier to achieve here since the windowing of N samples (tapering) is performed in the digital domain.

A wideband carrier-less digital-to-analog converter could be implemented using multiple narrow band converters (such as 1 bit Sigma-Delta D/A converters), in a similar manner to the analog-to-digital converter discussed above in conjunction with FIG. 14. The output of each different narrow band converter is combined after the passband filters remove out band noise (e.g. quantization noise and image bands).

Figure 17:
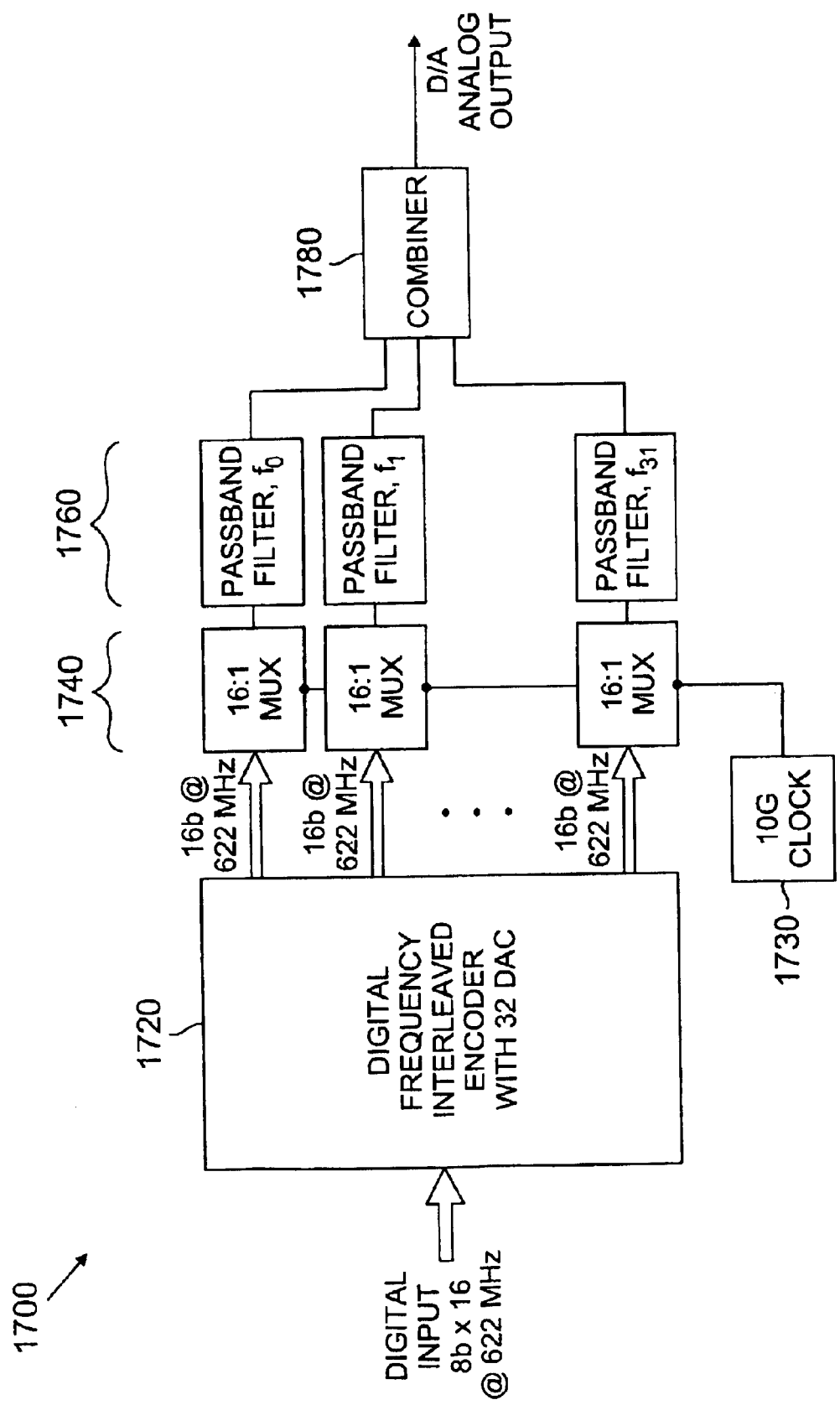
FIG. 17 illustrates an exemplary 10G carrier-less 8 b (8 bit) digital-to-analog converter in accordance with the present invention.

FIG. 17 illustrates an exemplary 10G carrier-less 8 b (8 bit) digital-to-analog converter 1700 in accordance with the present invention. As shown in FIG. 17, the digital input signal {8 bits (×16) at 622 MHz} is applied to a frequency interleaved encoder 1720 to produce 32 bitstreams at 622 MHz. Each bitstream is then multiplexed by a corresponding 16:1 multiplexer 1740-n at a rate determined by a clock 1730, and the serial bit stream is then filtered by a corresponding passband filter 1760-n, such as 1 bit second order Sigma-Delta converters. The output of each different narrow band converter 1760 is combined using a combiner 1780, for example, by adding the various narrow band signals.

It is to be understood that the embodiments and variations shown and described herein are merely illustrative of the principles of this invention and that various modifications may be implemented by those skilled in the art without departing from the scope and spirit of the invention.

I claim:

1. A method for converting an analog signal to a digital signal, said method comprising the steps of:
    decomposing said input analog signal into a plurality of frequency bands;
    demodulating said plurality of frequency bands to baseband signals; and
    separately converting said plurality of baseband signals to a digital signal.

2. The method of claim 1, wherein said converting step converts said frequency bands to a digital signal using an inverse Fourier transform.

3. The method of claim 1, wherein each of said plurality of frequency bands are processed using a plurality of overlapping windows.

4. The method of claim 3, further comprising the step of discarding a plurality of data points.

5. The method of claim 3, wherein said overlapping windows are shaped.

6. The method of claim 1, further comprising the step of calibrating for phase errors.

7. The method of claim 1, further comprising the step of calibrating for gain errors.

8. The method of claim 1, wherein said sampling step is performed in narrow passbands using a plurality of narrow-band converters.

9. The method of claim 1, wherein said narrow-band converters are Sigma-Delta converters.

10. A method for converting a digital signal to an analog output signal, said method comprising the steps of:

applying said digital signal to a frequency interleaved encoder that decomposes said digital signal into a plurality of frequency bands;

separately converting each of said plurality of frequency bands into a corresponding analog signal; and combining said corresponding analog signals to generate said analog output signal.

11. The method of claim 10, wherein said frequency interleaved encoder employs a discrete Fourier transform.

12. The method of claim 10, wherein said frequency interleaved encoder employs a number of overlapped discrete Fourier transforms with a windowing technique.

13. The method of claim 12, wherein a plurality of overlapping windows have a sum in the time domain that adds up to a constant.

14. The method of claim 10, wherein said step of separately converting each of said plurality of frequency bands is performed using a of narrow-band converter.

15. The method of claim 14, wherein said narrow-band converter is a passband Sigma-Delta converter.

16. The method of claim 10, wherein said step of separately converting each of said plurality of frequency bands is performed using a digital to analog converter and an analog mixer.

17. An analog to digital converter, comprising:

means for decomposing said input analog signal into a plurality of frequency bands;

means for demodulating said plurality of frequency bands to baseband signals; and a signal processor for separately converting said plurality of baseband signals to a digital signal.

18. The analog to digital converter of claim 17, wherein said means for decomposing said input analog signal into a plurality of frequency bands is an array of multipliers.

19. The analog to digital converter of claim 17, wherein said signal processor employs an inverse Fourier transform.

20. The analog to digital converter of claim 17, further comprising a plurality of narrow-band converters for sampling said plurality of frequency bands.

21. The analog to digital converter of claim 20, wherein said narrow-band converters are Sigma-Delta converters.

22. A digital to analog converter, comprising:

a frequency interleaved encoder that decomposes said digital signal into a plurality of frequency bands;

means for separately converting each of said plurality of frequency bands into a corresponding analog signal; and a combiner for combining said corresponding analog signals to generate said analog output signal.

23. The digital to analog converter of claim 22, wherein said frequency interleaved encoder employs a discrete Fourier transform.

24. The digital to analog converter of claim 22, wherein said frequency interleaved encoder employs a number of overlapped discrete Fourier transforms with a windowing technique.

25. The digital to analog converter of claim 22, wherein said means for separately converting each of said plurality of frequency bands is a narrow-band converter.

26. The digital to analog converter of claim 25, wherein said narrow-band converter is a passband Sigma-Delta converter.

27. The digital to analog converter of claim 22, wherein said means for separately converting each of said plurality of frequency bands is a digital to analog converter and an analog mixer.

* * * * *

UNITED STATES PATENT AND TRADEMARK OFFICE
CERTIFICATE OF CORRECTION

PATENT NO. : 6,771,198 B2
DATED : August 3, 2004
INVENTOR(S) : Azadet

It is certified that error appears in the above-identified patent and that said Letters Patent is hereby corrected as shown below:

Column 3,
Line 20, before "Each" replace "(IC)" with -- (DC) --.

Column 5,
Line 15, before "lies" and after "frequency," replace "(Din" with -- $\omega_{in}$ --.

Signed and Sealed this

Twenty-fourth Day of January, 2006

JON W. DUDAS
*Director of the United States Patent and Trademark Office*